(12) United States Patent
Divekar et al.

(10) Patent No.: US 11,470,730 B2
(45) Date of Patent: Oct. 11, 2022

(54) HOUSING FOR ELECTRICAL COMPONENTS

(71) Applicant: Appleton Grp LLC, Rosemont, IL (US)

(72) Inventors: Shriram R. Divekar, Pune (IN); Amit S. Kulkarni, Pune (IN); Abdulkhadar F. Goravankoll, Maharashtra (IN)

(73) Assignee: Appleton Grp LLC, Rosemont, IL (US)

( * ) Notice: Subject to any disclaimer, the term of this patent is extended or adjusted under 35 U.S.C. 154(b) by 360 days.

(21) Appl. No.: 16/776,274

(22) Filed: Jan. 29, 2020

(65) Prior Publication Data
US 2020/0253065 A1    Aug. 6, 2020

(30) Foreign Application Priority Data

Jan. 31, 2019 (IN) .............................. 201921003940

(51) Int. Cl.
*H05K 5/00* (2006.01)
*H02B 1/32* (2006.01)
*H02B 1/38* (2006.01)

(52) U.S. Cl.
CPC ............ *H05K 5/0021* (2013.01); *H02B 1/32* (2013.01); *H02B 1/38* (2013.01)

(58) Field of Classification Search
CPC ........... H05K 5/0021; H02B 1/32; H02B 1/38
See application file for complete search history.

(56) References Cited

U.S. PATENT DOCUMENTS

| 5,800,029 | A | * | 9/1998 | Robertson | .............. | A47B 81/00 |
| | | | | | | 312/271 |
| 8,254,089 | B2 | * | 8/2012 | Cosley | ..................... | H02B 1/32 |
| | | | | | | 361/640 |
| 2017/0299253 | A1 | * | 10/2017 | Wang | .................... | F25D 23/069 |

FOREIGN PATENT DOCUMENTS

| CN | 107086446 A | 8/2017 |
| CN | 105356328 B | 2/2018 |

OTHER PUBLICATIONS

Examination Report dated Sep. 16, 2020, issued in corresponding Indian Application No. 201921003940, 6 pages.

* cited by examiner

*Primary Examiner* — James Wu
*Assistant Examiner* — Hung Q Dang
(74) *Attorney, Agent, or Firm* — McDonnell Boehnen Hulbert & Berghoff LLP

(57) ABSTRACT

The present disclosure envisages a housing (1000). The housing (1000) has an operative upper compartment (200) and an operative lower compartment (100). A first lid (110) and a second lid (210) cover the lower and the upper compartments (100, 200) respectively. The lid (210) is openable. A panel (400) is configured to be inserted between the lower compartment (100) and the upper compartment (200) thus forming a partition between the compartments. The housing (1000) of the present disclosure, when utilized for housing data distribution elements and electrical power distribution elements separately in its compartments, provides safe access to the data distribution elements and prevents risk of touching live electrical components.

14 Claims, 18 Drawing Sheets

HOUSING FOR ELECTRICAL COMPONENTS

RELATED APPLICATIONS

This application claims priority to Indian Patent Application No. 201921003940 entitled "A Housing" filed on Jan. 31, 2019, the contents of which are incorporated by reference herein in their entirety.

FIELD

The present disclosure relates to organization of power and data distribution elements.

BACKGROUND

The background information herein below relates to the present disclosure but is not necessarily prior art.

In an industrial setup employing multiple partially or fully automated machineries, both power and data distribution panels are required for organizing switching components as per the desired layout. Generally, the data distribution panel is installed separately from the power distribution panel. Integration of the power and the data distribution panels is often sought to save space. However, there are a number of issues associated with such integration.

When integrated in a single housing, the power distribution panel and the data distribution panel generally share a cover sheet, which is termed as a 'dead-front' in the context of power distribution systems. A dead front allows an individual to access switching components of the power distribution systems while preventing any access to the live components such as bus bars. When a service person concerned with the data distribution part of an integrated data-and-power distribution panel has to access the data distribution components, (s)he will have to open the entire dead front of the housing. As a result, the live electrical components are also left exposed, which defeats the purpose of providing a dead front. Data service personnel may not be trained in dealing with high power systems. An open dead front only puts the data service person at the risk of unknowingly touching a live high-voltage wire or a bus bar, in case a tool or any other component inadvertently falls into the power distribution area of the housing.

Hence, there is need of a housing which ameliorates the aforementioned issues.

OBJECTS

Some of the objects of the present disclosure, which at least one embodiment satisfies, are as follows:

A primary object of the present disclosure is to provide a housing for a combined power and data distribution panel.

Another object of the present disclosure is to provide a housing for a combined power and data distribution panel, which ensures safety of service persons.

Other objects and advantages of the present disclosure will be more apparent from the following description, which is not intended to limit the scope of the present disclosure.

SUMMARY

The present disclosure envisages a housing. The housing comprises a pair of side walls, an operative floor, an operative roof, an operative lower compartment, an operative upper compartment, a first lid and a second lid. The first lid is provided to cover the operative lower compartment. The second lid is provided to cover the operative upper compartment and is openable to allow access to the contents of the operative upper compartment. Optionally, a panel is configured to be inserted between the lower compartment and the upper compartment, thus forming a partition between the compartments.

In an embodiment, the housing comprises the panel and the panel is configured such that when contents of one of the compartments are accessed, access to the contents of the other compartment is prevented. In an embodiment, the compartment of which contents are accessed is the upper compartment and the compartment to which access is prevented is the lower compartment.

In an embodiment, at least one guiding groove is provided along the side walls. The guiding groove is configured to permit at least a portion of the second lid to form a temporary partition between the lower compartment and the upper compartment. In another embodiment, two guiding grooves are provided in the side walls, one groove provided each on one of the side walls. In another embodiment, the guiding grooves are provided along the side walls between the lower compartment and the upper compartment.

In another embodiment, the second lid is swivelably mounted to cover the upper compartment.

In yet another embodiment, the second lid has one or two wings. In yet another embodiment, the second lid is swivelable about a vertical axis.

In still another embodiment, the first lid is fixed in position and is provided with at least one opening to provide access to the contents of the lower compartment.

In yet another embodiment, the first lid is openable to allow access to contents of the lower compartment.

In still another embodiment, the housing is provided with a door to access the first lid and the second lid.

In an embodiment, the upper compartment houses data distribution elements and the upper compartment houses data distribution elements. In another embodiment, the lower compartment houses data distribution elements and the upper compartment houses power distribution elements. In an embodiment, the side walls are provided with holding means for supporting a hybrid cable containing at least one data cable and at least one power cable.

BRIEF DESCRIPTION OF ACCOMPANYING DRAWING

Figure 1:
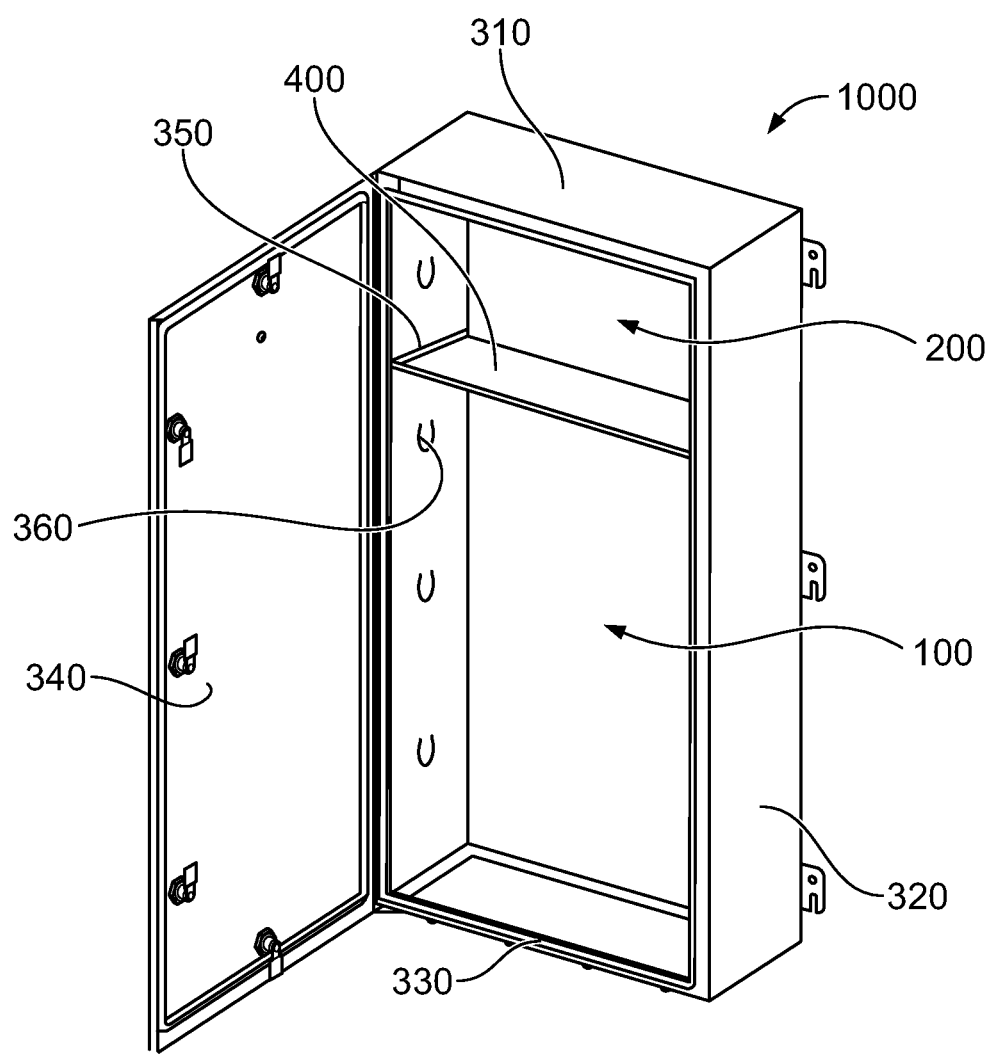
FIG. 1 illustrates a housing of the present disclosure without lids.

LIST OF REFERENCE NUMERALS 1000 housing
100 operative lower compartment
110 first lid
115 opening
120 first lid handle
130 pivoting-and-sliding mechanism
135 pivoting element
140 bracket
145 link
200 operative upper compartment
210 second lid
220 second lid handle
230 slot
310 roof wall
320 side wall
330 floor wall
340 door
350 groove
360 holding means
365 cables
400 panel

DETAILED DESCRIPTION

Embodiments, of the present disclosure, will now be described with reference to the accompanying drawing.

Embodiments are provided so as to thoroughly and fully convey the scope of the present disclosure to the person skilled in the art. Numerous details are set forth, relating to specific components, and methods, to provide a complete understanding of embodiments of the present disclosure. It will be apparent to the person skilled in the art that the details provided in the embodiments should not be construed to limit the scope of the present disclosure. In some embodiments, well-known processes, well-known apparatus structures, and well-known techniques are not described in detail.

The terminology used, in the present disclosure, is only for the purpose of explaining a particular embodiment and such terminology shall not be considered to limit the scope of the present disclosure. As used in the present disclosure, the forms "a", "an" and "the" may be intended to include the plural forms as well, unless the context clearly suggests otherwise. The terms "comprises", "comprising", "including" and "having" are open-ended transitional phrases and therefore specify the presence of stated features, integers, steps, operations, elements, modules, units and/or components, but do not forbid the presence or addition of one or more other features, integers, steps, operations, elements, components, and/or groups thereof. The particular order of steps disclosed in the method and process of the present disclosure is not to be construed as necessarily requiring their performance as described or illustrated. It is also to be understood that additional or alternative steps may be employed.

When an element is referred to as being "mounted on", "engaged to", "connected to" or 'coupled to" another element, it may be directly on, engaged, connected or coupled to the other element. As used herein, the term "and/or" includes any and all combinations of one or more of the associated listed elements.

The terms first, second, third, etc., should not be construed to limit the scope of the present disclosure as the aforementioned terms may be only used to distinguish one element, component, region, layer or section from another component, region, layer or section. Terms such as first, second, third etc., when used herein do not imply a specific sequence or order unless clearly suggested by the present disclosure.

Terms such as "inner", "outer", "beneath", "below", "lower", "above", "upper" and the like, may be used in the present disclosure to describe relationships between different elements as depicted from the figures.

In industries such as those associated with heavy machineries, robotics, automation, information technology and the like, intensive power and data handling requirement exists. Routing of a dense network of power cables as well as data cables needs significant planning, in order to optimize utilization of the available space and also provide an organized layout of the cables and their associated distribution panels. Power distribution panels come with an additional inner lid termed as a 'dead front', which is a sheet covering the live wires, bus bars etc. while allowing access to manually operable elements such as switches.

When integrated into a single housing for further saving space, data distribution elements and power distribution elements need to be isolated from each other for a number of reasons. The foremost reason being, the service personnel for a data distribution system may be different from those for a power distribution system. When the data distribution section of the housing is being accessed for servicing, the power distribution section still needs to be covered. Safety training for handling high voltage elements may not be given to data service personnel. They may be exposed to a potential safety hazard of accidentally touching live wires or bus bars, in a case when one of their tools falls into the power distribution section of the housing. Therefore, there is a need to provide a means for isolation of the data distribution system and the power distribution system housed in a single housing.

Figure 2:
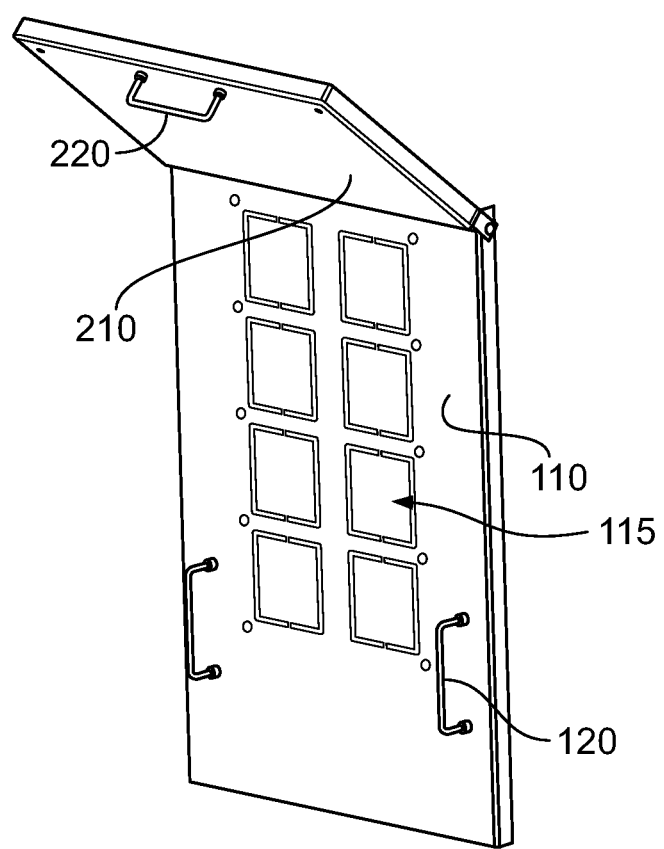
FIG. 2 illustrates lids of a first embodiment of the present disclosure.

The present disclosure envisages a split-type lid as shown in FIG. 2 for a housing 1000 as shown in FIG. 1. The housing 1000 of the present disclosure, defined by side walls 320, an operative floor 330 and an operative roof 310, has at least two compartments. The housing 1000 has an operative lower compartment 100 and an operative upper compartment 200. The housing 1000 is provided with split lid—a first lid 110 which covers the operative lower compartment 100 and a second lid 210 which covers the operative upper compartment 200. The second lid 210 is openable to allow access to contents of the second compartment 200. The first lid 110 and the second lid 210 are configured such that when contents of one of the lower compartment 100 and the upper compartment 200 are accessed, access to contents of the other compartment is prevented. A panel 400 is optionally configured to be inserted between the lower compartment 100 and the upper compartment 200 thus forming a partition between the compartments 100, 200.

In an embodiment, the housing 1000 comprises a panel 400 and the panel 400 is configured such that when contents of one of the compartments 100, 200 are accessed, access to the contents of the other compartment is prevented. The compartment of which contents are accessed is the upper compartment 200 and the compartment to which access is prevented is the lower compartment 100.

In an embodiment, the partition formed between the compartments 100, 200 is fixed. Thus, the panel 400 is fixedly installed in the housing 1000 between the compartments 100, 200.

In another embodiment, the partition formed between the compartments 100, 200 is temporary. In an embodiment, the housing 1000 is provided with at least one groove 350 in one of the side walls 320, the grooves 350 being visible in FIG. 1. The grooves 350 are located between the lower compartment 100 and the upper compartment 200. The grooves 350 are configured to receive the panel 400 to form a temporary partition between the compartments 100, 200.

Figure 3:
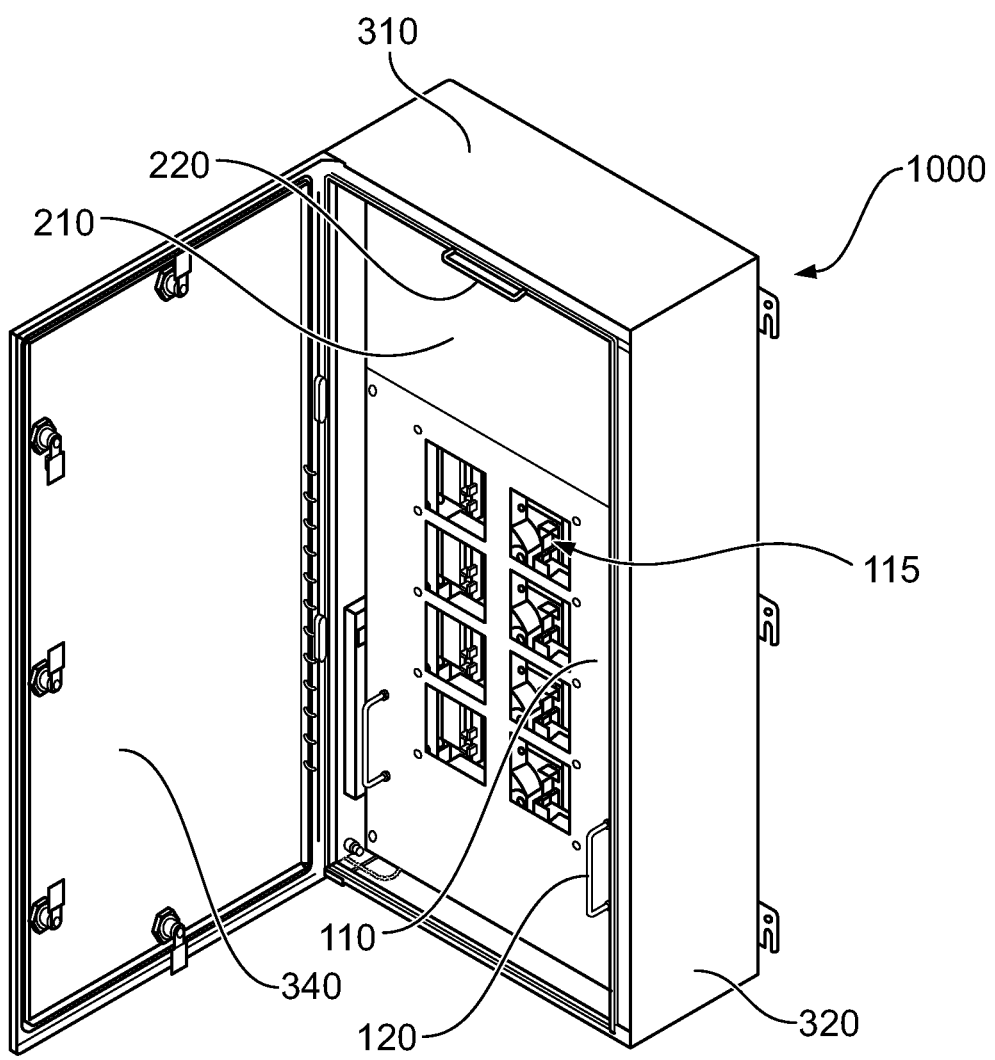
FIG. 3 illustrates a housing of the present disclosure provided with lids of FIG. 2.
Figure 4:
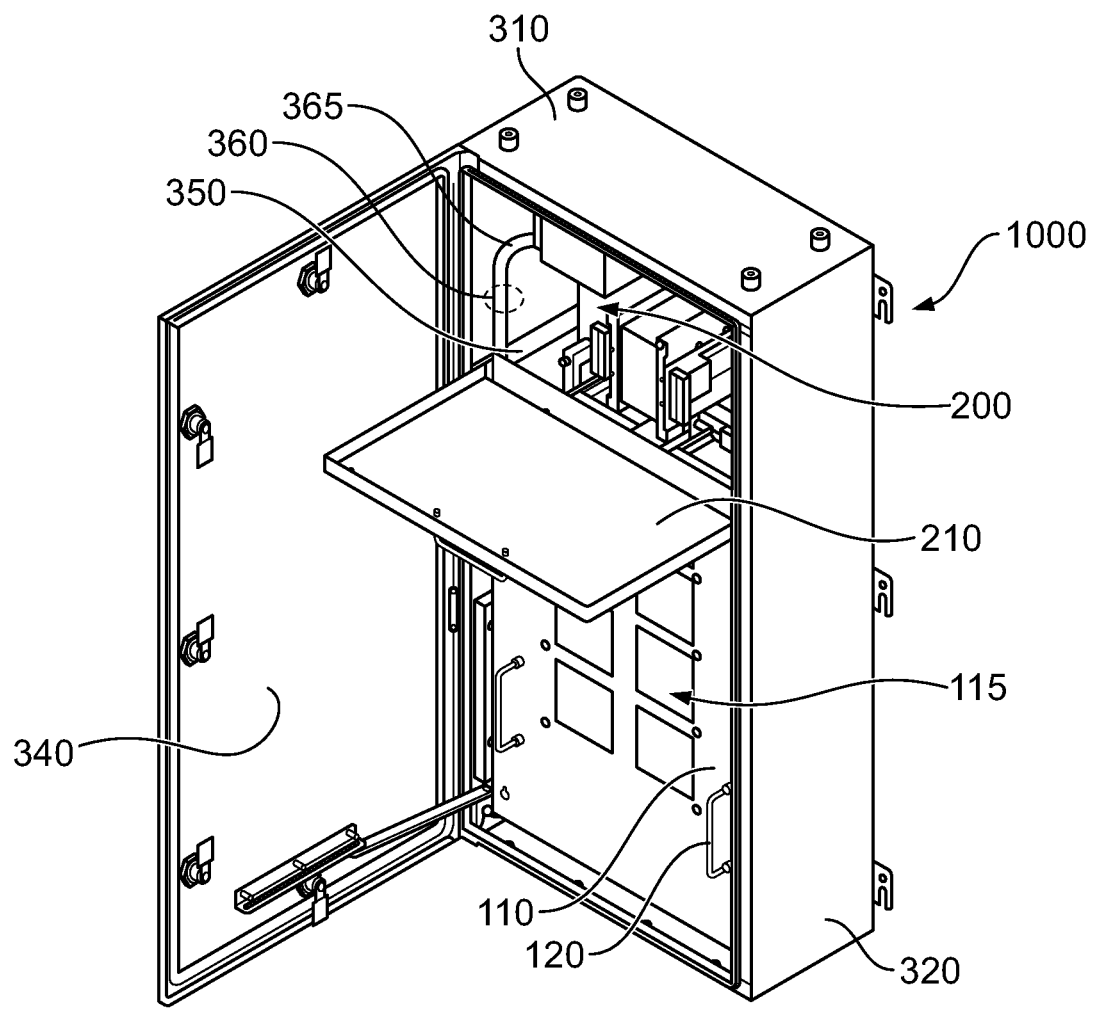
FIG. 4 illustrates the housing of FIG. 3 with the second lid opened.
Figure 5:
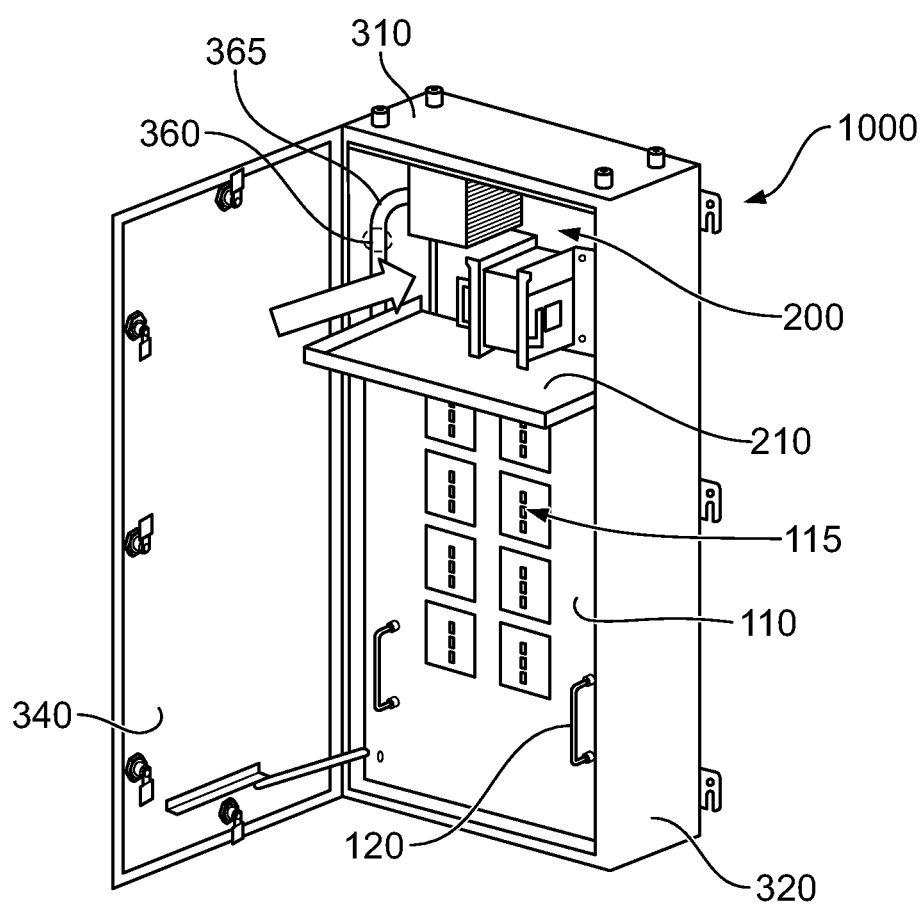
FIG. 5 illustrates the housing of FIG. 3 with the second lid slid inside grooves.
Figure 6:
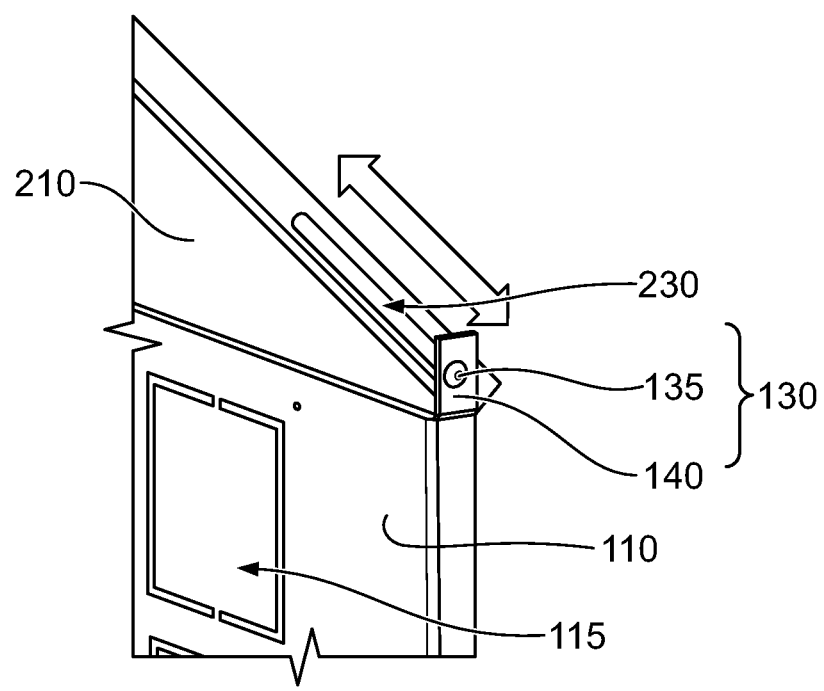
FIG. 6 illustrates a zoomed-in view of the pivoting-and-sliding mechanism for the second lid of FIG. 2.

In the first embodiment illustrated in FIGS. 2-6, the second lid 210 of the housing 1000 is swivelable. The closed state of the lid 210 is shown in FIG. 3. By holding a handle 220 provided on the operative external surface of the second lid 210, the second lid 210 is swivelled to provide access to the contents of the upper compartment 200, as shown in FIG. 4. The aforementioned grooves 350 are configured to permit the second lid 210 to be slid in therein, as shown in FIG. 5. Thus, the second lid 210 forms a temporary partition between the lower compartment 100 and the upper compartment 200. In an embodiment, a pivoting-and-sliding mechanism 130 is provided between the edges of the second lid 210 and the brackets 140 on which the second lid 210 is pivoted, as shown in the zoomed-in view of FIG. 6. The pivoting-and-sliding mechanism 130 comprises a slot 230 made along folded lateral edges of the second lid 210, wherein a pivoting element 135 mounted on the bracket 140 is inserted through one end of the slot. The slot 230 allows sliding of the second lid 210 in the swivelled state along the pivoting point. As the second lid 210 is slid completely along the slot 230 and through the grooves 350, the temporary partition is created between the two compartments of the housing 1000. As a result, the need of a separate panel is eliminated. In an embodiment, a locking arrangement in the form of a spring-loaded plunger with a ball is integrated with pivoting element 135.

Figure 7:
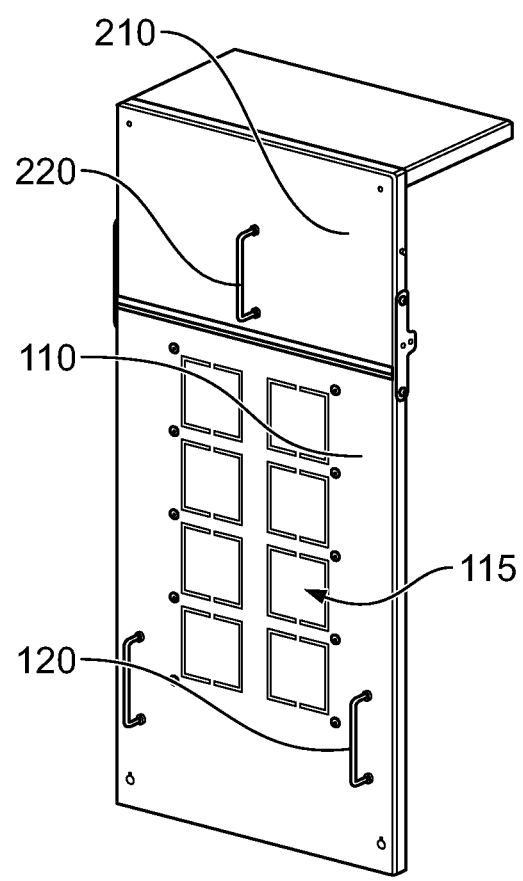
FIG. 7 illustrates lids of a second embodiment of the present disclosure.
Figure 8A:
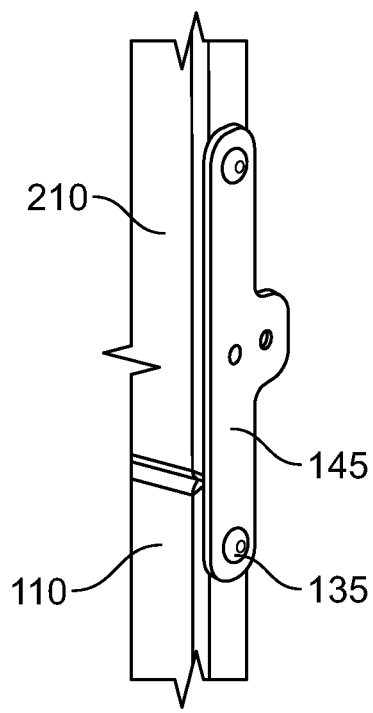
FIG. 8 (including FIGS. 8A and 8B) illustrates a zoomed-in view of the pivoting mechanism for the second lid of FIG. 7.
Figure 8B:
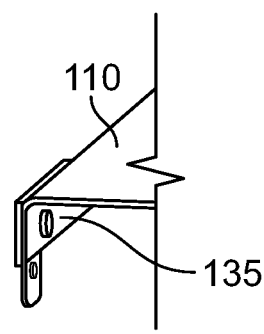

In the second embodiment illustrated in FIGS. 7-8B, the second lid 210 of the housing 1000 has an inverted L-shaped cross section and is swivelable about a pivot point configured using a pivoting element 135 to provide access to contents of the upper compartment 200. A link 145 connects the lid 210 with the pivoting element 135, wherein the pivoting element is installed in the first lid 110, as illustrated in FIG. 8A. In a closed state, the vertical portion of the second lid 210 covers the upper compartment 200 and the horizontal portion remains flushed with the roof 310 of the housing 1000. To swivel the second lid 210 about the pivoting element 135, the lid is pulled in an operative outward direction, whereupon the link 145 rotates about the pivoting element 135, and the lid 210 is thereafter pushed in the vertically downward direction to allow access to the upper compartment 200. In this operative state, the vertical portion of the second lid 210 remains flushed with the first lid 110 on the operative front surface or the operative rear surface and the horizontal section forms a temporary barrier between the lower compartment 100 and the upper compartment 200. Moreover, a panel 400 is provided along with the housing 1000 as shown in FIG. 1. The aforementioned grooves 350 are configured to permit the panel 400 to be slid in therein. Thus, the panel 400 forms a temporary partition between the lower compartment 100 and the upper compartment 200.

Figure 9:
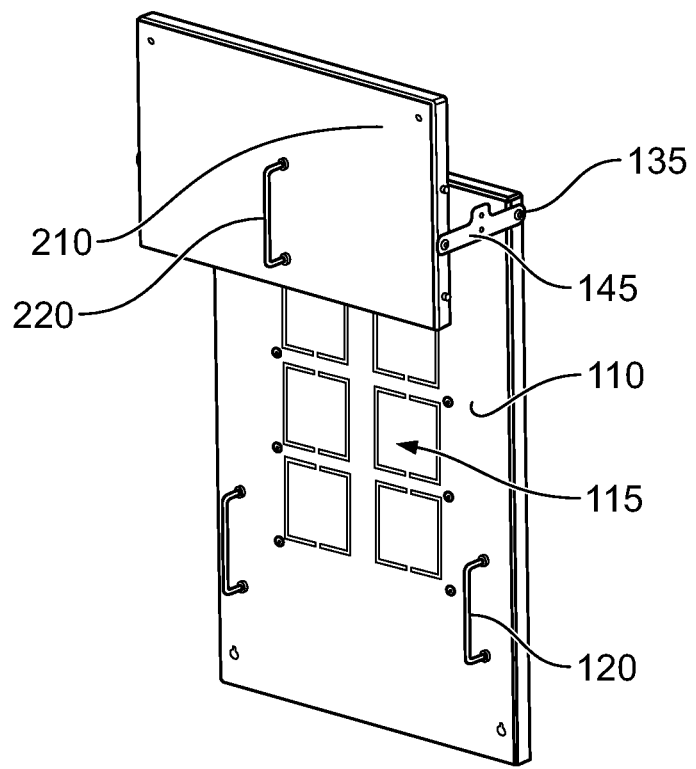
FIG. 9 illustrates lids of an embodiment of a third embodiment of the present disclosure.
Figure 10:
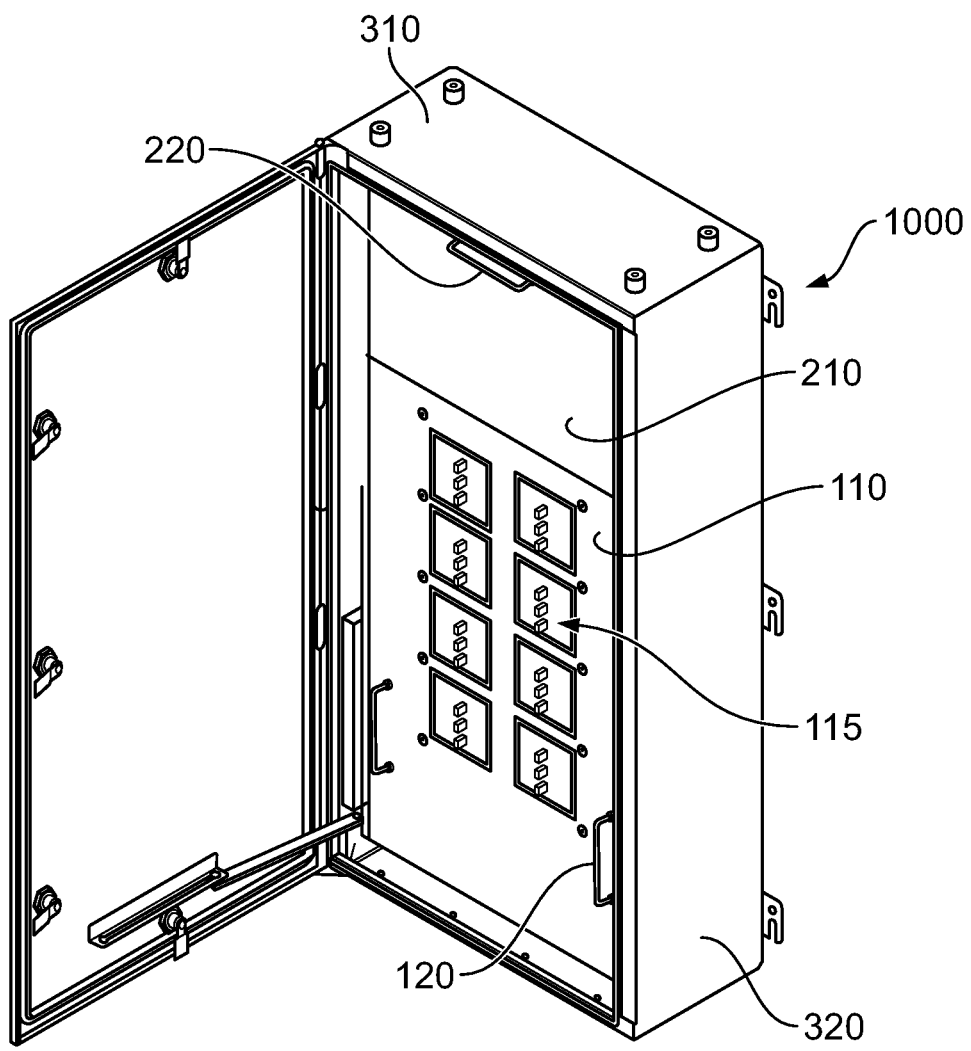
FIG. 10 illustrates a housing of the present disclosure provided with the lids of FIG. 9.
Figure 11:
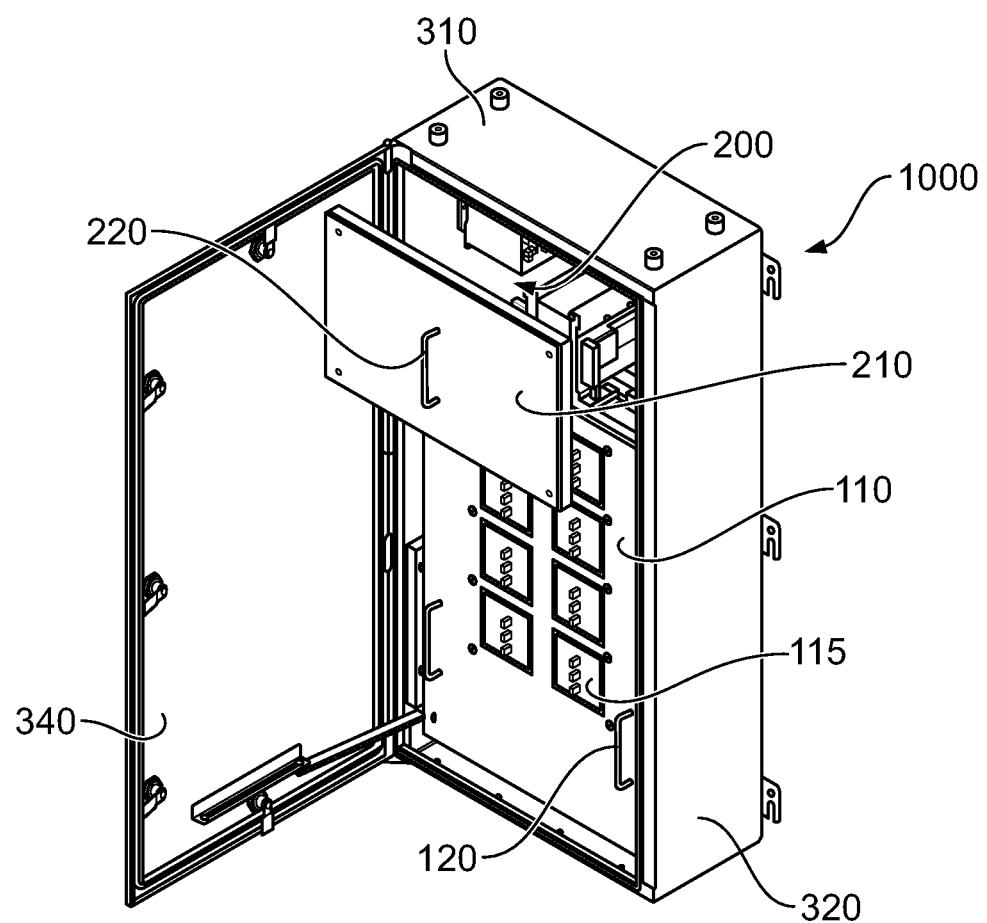
FIG. 11 illustrates the housing of FIG. 10 with the second lid open.
Figure 12:
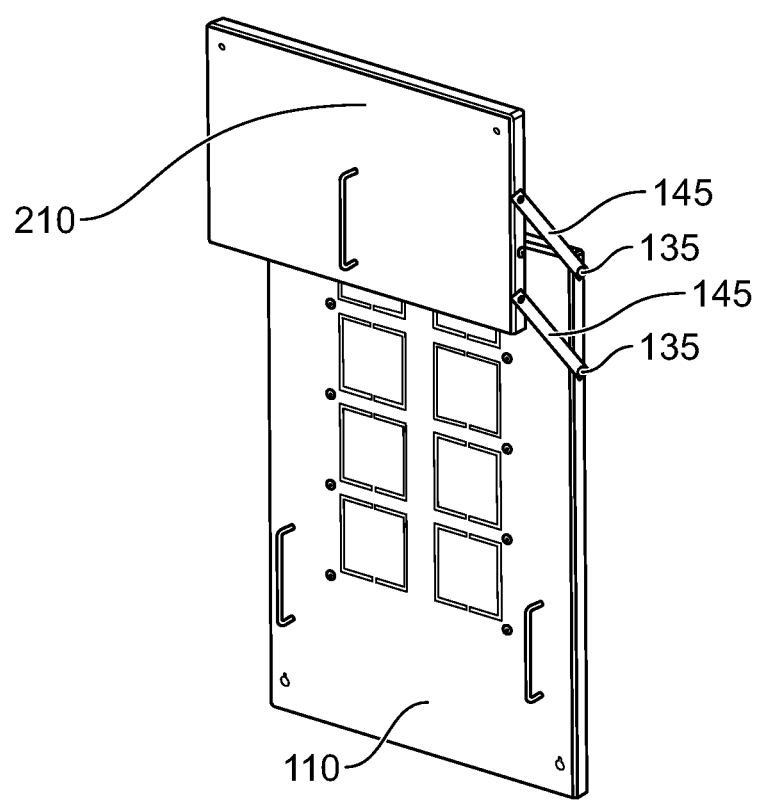
FIG. 12 illustrates lids of another embodiment of the third embodiment of the present disclosure.

In the third embodiment illustrated in FIGS. 9-12, the second lid 210 of the housing 1000 is swivelable about a pivot point configured using a pivoting element 135 to provide access to contents of the upper compartment 200. The second lid 210 is rotatable about the pivoting element 135 through a link 145 which connects the second lid 210 with the pivoting element 135, as shown in FIG. 9, wherein the pivoting element is installed in the first lid 110. In a closed state, the second lid 210 covers the upper compartment 200, as illustrated in FIG. 10. To swivel the second lid 210 about the pivoting element 135, the second lid 210 is pulled in an operative outward direction as illustrated in FIG. 9, whereupon the link 145 rotates about the pivoting element 135, and the lid 210 is thereafter pushed in the vertically downward direction to allow access to the upper compartment 200. In this operative state as shown in FIG. 11, the second lid 210 remains flushed with the first lid 110 on the operative front surface. In an embodiment as shown in FIG. 12, a pair of links 145 connects the second lid 210 with the pivoting elements 135, as shown in FIG. 12. Moreover, a panel 400 (not shown in FIGS. 9-12) is provided alongwith the housing 1000 as shown in FIG. 1. The aforementioned grooves 350 are configured to permit the panel 400 to be slid in therein. Thus, the panel 400 forms a temporary partition between the lower compartment 100 and the upper compartment 200.

Figure 13:
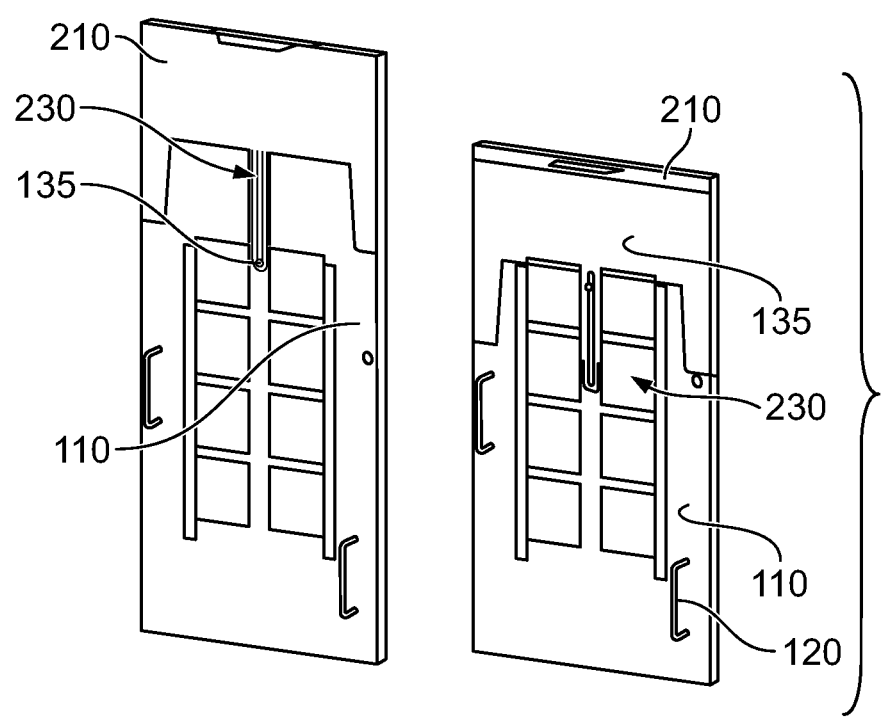
FIG. 13 illustrates lids of a fourth embodiment of the present disclosure.
Figure 14:
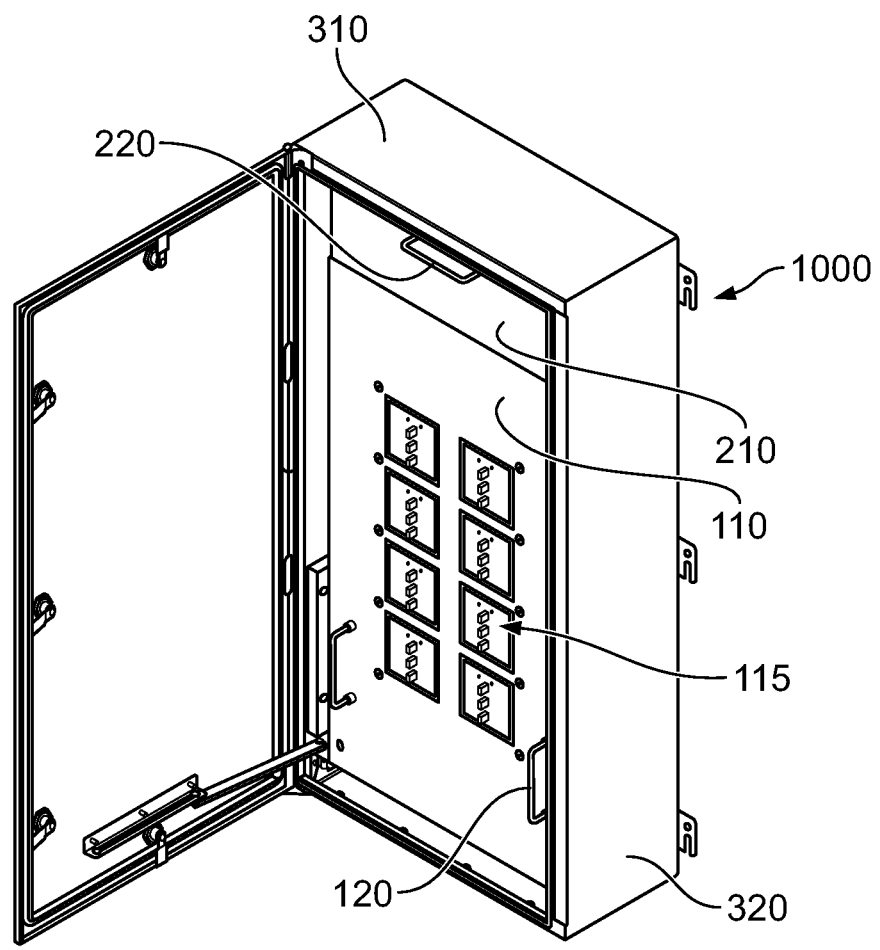
FIG. 14 illustrates a housing of the present disclosure provided with the lids of FIG. 12.
Figure 15:
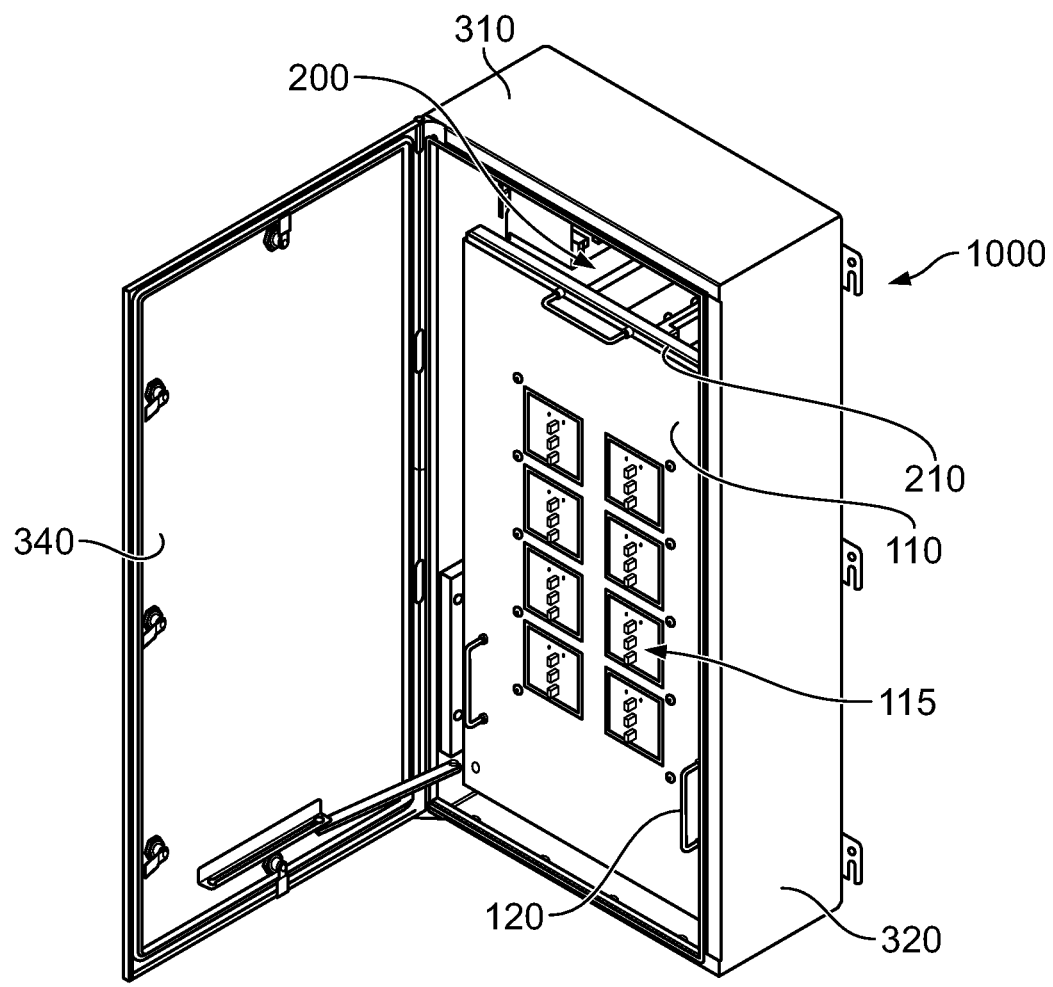
FIG. 15 illustrates the housing of FIG. 14 with the second lid open.

In the fourth embodiment illustrated in FIGS. 13-15, the second lid 210 of the housing 1000 is slidable along a slot 230 configured in the second lid 210 to provide access to contents of the upper compartment 200. The slot 230 is provided in an elongate extension provided at the bottom edge of the second lid 210 and a pin 135 is installed in the first lid 110, as shown in FIG. 13. In a closed state, the second lid 210 covers the upper compartment 200, as shown in FIG. 14. To slide the second lid 210 along the pin 135, the second lid 210 is pushed in an operative inward direction, whereafter the lid 210 is slid in an operative downward direction, to allow access to the upper compartment 200. In this operative state illustrated in FIG. 15, the second lid 210 remains flushed with the first lid 110 on the operative rear surface of the first lid 110. Moreover, a panel 400 (not shown in FIGS. 13-15) is provided along with the housing 1000 as shown in FIG. 1. The aforementioned grooves 350 are configured to permit the panel 400 to be slid in therein. Thus, the panel 400 forms a temporary partition between the lower compartment 100 and the upper compartment 200.

Figure 16:
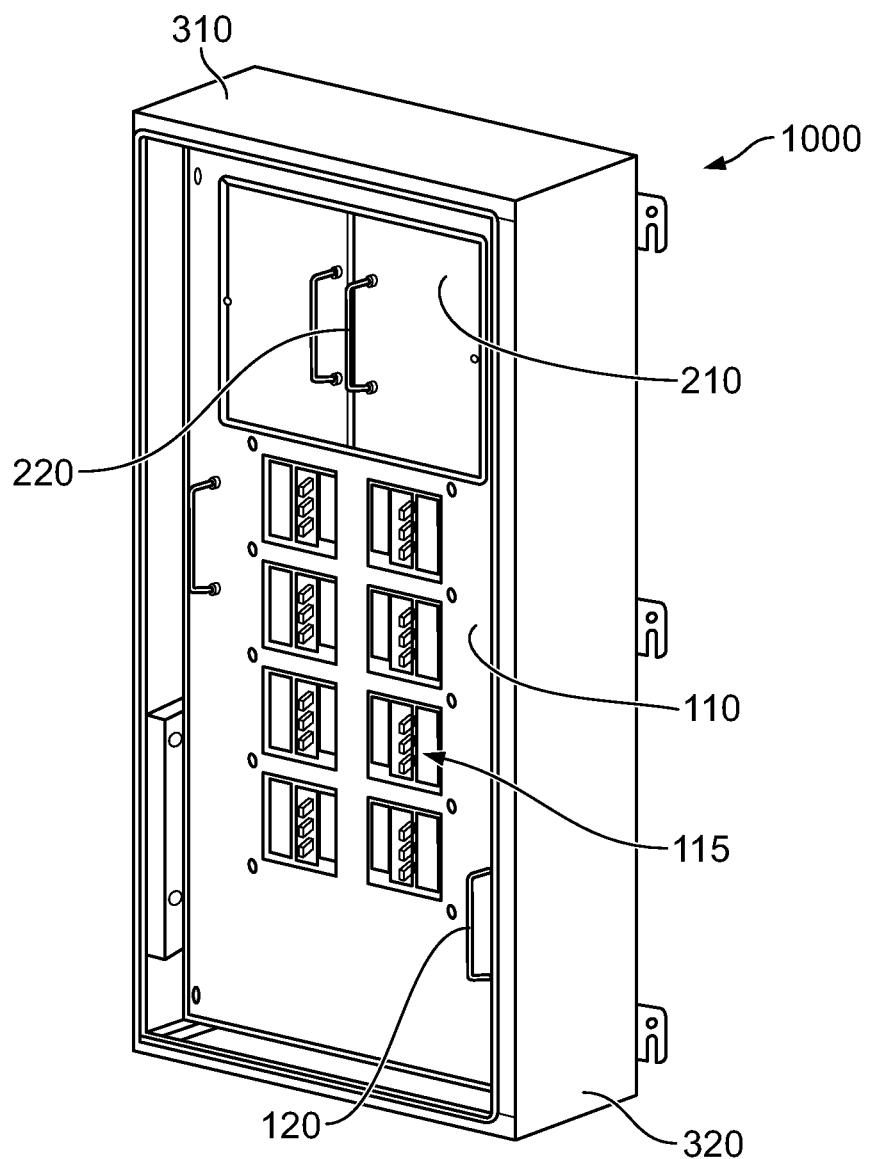
FIG. 16 illustrates a housing of the present disclosure provided with the lids of an embodiment of a fifth embodiment of the present disclosure.
Figure 17:
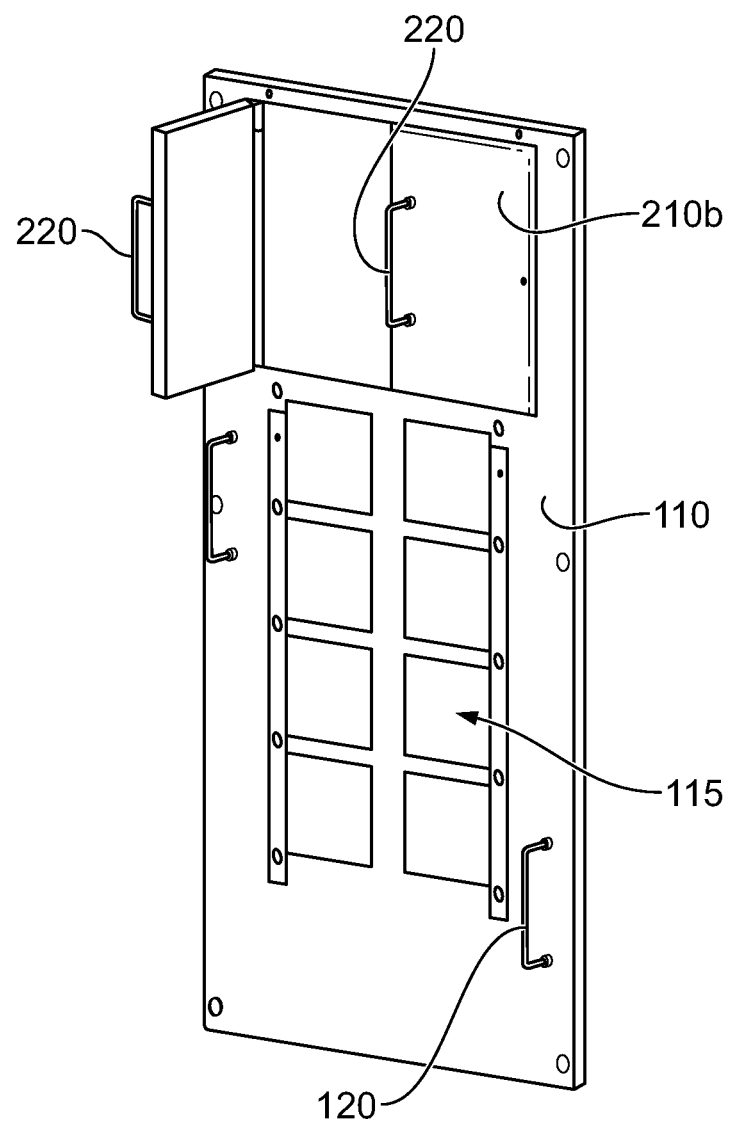
FIG. 17 illustrates the housing of FIG. 16 with one of the second lids open.
Figure 18:
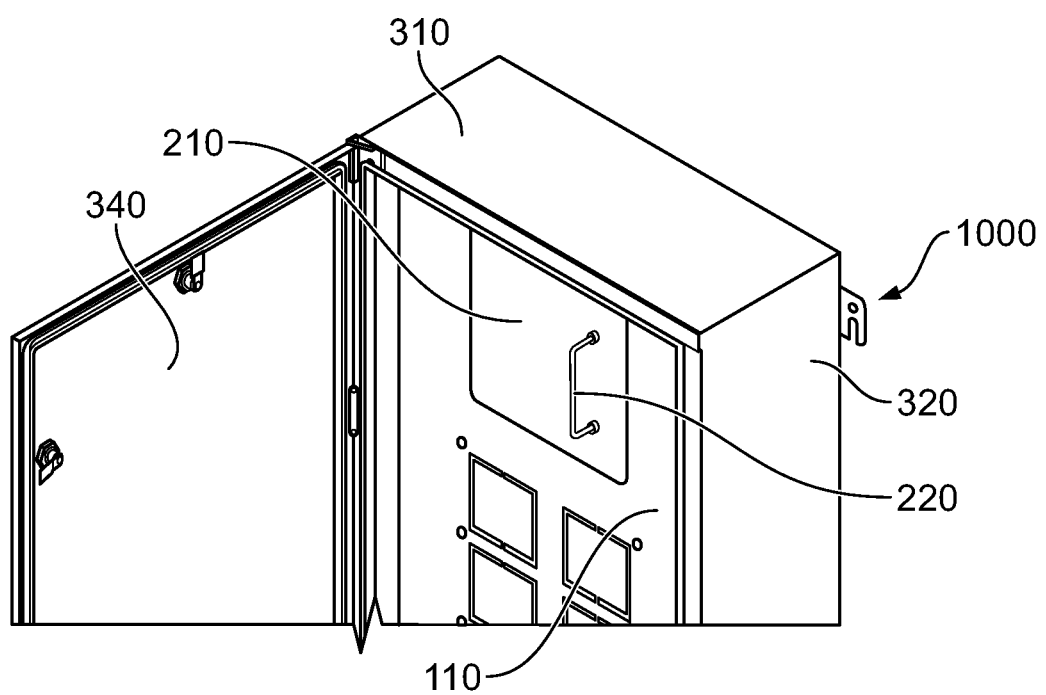
FIG. 18 illustrates lids of another embodiment of the fifth embodiment of the present disclosure.

In the fifth embodiment illustrated in FIGS. 16-18, at least one the second lid 210 of the housing 1000 is hingeable about a hinge (not shown), the hinge been configured on a vertical edge of a rectangular aperture provided in the first lid 110. Thus, the first lid 110 extends from the roof 310 to the floor 320 of the housing 1000. The second lid 210 is configured to provide access to contents of the upper compartment 200. In a closed state, the wings of the second lids 210 cover the upper compartment 200, as illustrated in FIG. 16. To open the wings of the second lids 210, the wings are pulled in an operative outward direction as illustrated in FIG. 17 to allow access to the upper compartment 200. In an embodiment as shown in FIG. 18, a singular second lid 210 is provided to cover the upper compartment 200. Moreover, a panel 400 (not shown in FIGS. 16-18) is provided along with the housing 1000 as shown in FIG. 1. The aforementioned grooves 350 are configured to permit the panel 400 to be slid in therein. Thus, the panel 400 forms a temporary partition between the lower compartment 100 and the upper compartment 200.

In an embodiment, the housing 1000 is provided with a door 340 at an operative front side of the first lid 110 and the second lid 210. The door 340 is hinged along one of its operative vertical edges. The door 340 functions as an additional protection for the components of the housing 1000. An operator or a service person has to open the door 340 first to be able to open the second lid 210 in order to access the components of the operative upper compartment 200.

In an embodiment, the upper compartment 200 houses data distribution elements and the lower compartment 100 houses power distribution elements. The power distribution elements housed in the operative lower compartment 100 include electrical components such as switch gears, circuit breakers, fuses, bus bars, ground bars, power and energy meters, relays, power conditioning and regulating devices, surge protective devices, and so on. The first lid 110 acts as a 'dead front' for the power distribution elements housed in the lower compartment 100. The first lid 110 is generally fixed in position and is provided with openings 115 to provide safe access to manually operable elements such as switch gears while covering live wires, bus bars and the like. However, with the help of a handle 120, the first lid 110 can be opened by removing the lid 110 from the position or by revolving around a hinge, to further access the rest of the contents of the lower compartment 100. The data distribution elements housed in the operative upper compartment 200 include fibre patch panels and fibre-optic cables connected thereto. In an embodiment, the patch panels are mounted inside the upper compartment 200 using a method selected from a group consisting of wall mounting, rack mounting, rail mounting or any other suitable method of mounting. In an embodiment, a hybrid cable 365 is provided, wherein the hybrid cable 365 comprises both data and power cable strands. For organizing the cable 365 inside the housing 1000, a holding means 360 is provided, as shown in FIGS. 1, 4 and 5. In an embodiment, the holding means 360 is attached to the side walls 320 of the housing 1000. In another embodiment, separate data cables and separate power cables are provided. Appropriate insulation from electric noise is provided to the data strands using sheaths. In another embodiment, the fibre and the power cables are routed differently through the housing 1000. Spare fibre cables are provided (specifically, one spare cable for every cable) so that they can be readily replaced in case of damage to any of the cables currently in use.

When a service person for the data distribution system accesses components contained in the upper compartment 200, the lid 210 acts as a barrier between the upper compartment 200 and the lower compartment 100 in the first and the second embodiments, and the panel acts as a barrier between the upper compartment 200 and the lower compartment 100 in the third, the fourth and the fifth embodiments. Thus, even if a component or a tool slips out of the hand of the service person, the same would fall on the lid 210 which firmly rests between the grooves 350 and not inside the lower compartment 100 where live high-voltage electrical components are contained. The risk of accidental contact and resultant safety hazard is therefore avoided completely, ensuring safety of the service person.

In another embodiment, the housing 1000 is configured to house data distribution elements in the lower compartment 100 and power distribution elements in the upper compartment 200. The second lid 210 acts as a 'dead front' for the power distribution elements housed in the upper compartment 200. The first lid 110 is openable to allow access to the data distribution elements housed in the lower compartment 100. When data distribution elements housed in the lower compartment 100 are accessed, access to power distribution elements housed in the upper compartment 200 is prevented. The arrangement for preventing access from one compartment to the other, when contents of one of the compartments are accessed, is an arrangement similar to those illustrated in FIGS. 2-18.

The foregoing description of the embodiments has been provided for purposes of illustration and not intended to limit the scope of the present disclosure. Individual components of a particular embodiment are generally not limited to that particular embodiment, but, are interchangeable. Such variations are not to be regarded as a departure from the present disclosure, and all such modifications are considered to be within the scope of the present disclosure.

TECHNICAL ADVANCEMENTS

The present disclosure described herein above has several technical advantages including, but not limited to, the realization of a housing, which:
provides a means for isolation of its operative upper and lower compartments;
allows independent access to one compartment at a time; and
ensures safety of service personnel for contents of one compartment, in case access to the second compartment is potentially hazardous.

The foregoing disclosure has been described with reference to the accompanying embodiments which do not limit the scope and ambit of the disclosure. The description provided is purely by way of example and illustration.

The embodiments herein and the various features and advantageous details thereof are explained with reference to the non-limiting embodiments in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The foregoing description of the specific embodiments so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

The use of the expression "at least" or "at least one" suggests the use of one or more elements or ingredients or quantities, as the use may be in the embodiment of the disclosure to achieve one or more of the desired objects or results.

Any discussion of documents, acts, materials, devices, articles or the like that has been included in this specification is solely for the purpose of providing a context for the disclosure. It is not to be taken as an admission that any or all of these matters form a part of the prior art base or were common general knowledge in the field relevant to the disclosure as it existed anywhere before the priority date of this application.

The numerical values mentioned for the various physical parameters, dimensions or quantities are only approximations and it is envisaged that the values higher/lower than the numerical values assigned to the parameters, dimensions or quantities fall within the scope of the disclosure, unless there is a statement in the specification specific to the contrary.

While considerable emphasis has been placed herein on the components and component parts of the preferred embodiments, it will be appreciated that many embodiments can be made and that many changes can be made in the preferred embodiments without departing from the principles of the disclosure. These and other changes in the preferred embodiment as well as other embodiments of the disclosure will be apparent to those skilled in the art from the disclosure herein, whereby it is to be distinctly understood that the foregoing descriptive matter is to be interpreted merely as illustrative of the disclosure and not as a limitation.

We claim:

1. A housing (1000) comprising:
   a pair of side walls (320), an operative floor (330) and an operative roof (310);
   an operative lower compartment (100) and an operative upper compartment (200);
   a first lid (110) provided to cover said operative lower compartment (100);
   a second lid (210) provided to cover said operative upper compartment (200) and openable to allow access to the contents of said operative upper compartment (200);
   a panel (400) configured to be inserted between said lower compartment (100) and said upper compartment (200) thus forming a partition between said compartments;
   wherein said partition is a temporary partition;
   wherein two guiding grooves (350) are provided in said side walls (320), one groove (350) provided each on one of said side walls (320);
   said guiding groove (350) are configured to permit at least a portion of said panel (400) to form a temporary partition between said lower compartment (100) and said upper compartment (200); and
   wherein said second lid (210) is swivelably mounted to cover said upper compartment (200) and is configured to be inserted in said grooves (350), a bottom end first, to form the temporary partition between said lower compartment (100) and said upper compartment (200).

2. The housing (1000) as claimed in claim 1, wherein said partition is fixed.

3. The housing (1000) as claimed in claim 2, wherein said second lid (210) in an open configuration forms said partition.

4. The housing (1000) as claimed in claim 1, wherein the housing (1000) comprises the panel (400) and the panel (400) is configured such that when contents of one of said compartments (100, 200) are accessed, access to the contents of the other compartment is prevented.

5. The housing (1000) as claimed in claim 4, wherein the compartment of which contents are accessed is said upper compartment (200) and the compartment to which access is prevented is said lower compartment (100).

6. The housing (1000) as claimed in claim 1, wherein said guiding grooves (350) are provided along said side walls (320) between said lower compartment (100) and said upper compartment (200).

7. The housing (1000) as claimed in claim 1, wherein said second lid (210) has one or two wings.

8. The housing (1000) as claimed in claim 7, wherein said second lid (210) is swivelable about a vertical axis.

9. The housing (1000) as claimed in claim 1, wherein said first lid (110) is fixed in position and is provided with at least one opening (115) to provide access to the contents of said lower compartment (100).

10. The housing (1000) as claimed in claim 1, wherein said first lid (110) is openable to allow access to contents of said lower compartment (100).

11. The housing (1000) as claimed in claim 1, wherein said housing (1000) is provided with a door (340) to access said first lid (110) and said second lid (210).

12. The housing (1000) as claimed in claim 1, wherein:
    said upper compartment (200) houses data distribution elements; and
    said lower compartment (100) houses power distribution elements.

13. The housing (1000) as claimed in claim 1, wherein:
    said lower compartment (100) houses data distribution elements; and
    said upper compartment (200) houses power distribution elements.

14. The housing (1000) as claimed in claim 1, wherein said side walls (320) are provided with holding means (360) for supporting a hybrid cable (365) containing at least one data cable and at least one power cable.

* * * * *